United States Patent
Wakaki (10) Patent No.: US 9,479,117 B2
(45) Date of Patent: Oct. 25, 2016

(54) RADIO-FREQUENCY AMPLIFIER CIRCUIT AND CONTROL VOLTAGE SETTING METHOD FOR RADIO-FREQUENCY AMPLIFIER CIRCUIT

(71) Applicant: Murata Manufacturing Co., Ltd., Kyoto (JP)

(72) Inventor: Ken Wakaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/926,367

(22) Filed: Oct. 29, 2015

(65) Prior Publication Data

US 2016/0049908 A1    Feb. 18, 2016

Related U.S. Application Data

(63) Continuation of application No. PCT/JP2014/062769, filed on May 14, 2014.

(30) Foreign Application Priority Data

May 17, 2013    (JP) .................................. 2013-104625

(51) Int. Cl.
  *H03F 3/04*    (2006.01)
  *H03F 1/26*    (2006.01)
  (Continued)

(52) U.S. Cl.
  CPC .......... *H03F 1/0205* (2013.01); *H03F 1/0266* (2013.01); *H03F 1/0272* (2013.01);
  (Continued)

(58) Field of Classification Search
  CPC .............. H03F 3/04; H03F 1/26; H03G 3/10
  USPC .................................. 330/311, 296, 285, 149
  See application file for complete search history.

(56) References Cited

U.S. PATENT DOCUMENTS 8,994,449 B2 * 3/2015 Hodel ................. H01L 27/0629
                                                    327/581
2005/0007200 A1    1/2005 Inoue
(Continued)

FOREIGN PATENT DOCUMENTS

JP    2002-009564 A    1/2002
JP    2005-033650 A    2/2005
(Continued)

OTHER PUBLICATIONS

International Search Report issued in Application No. PCT/JP2014/062769 dated Jul. 22, 2014.
(Continued)

*Primary Examiner* — Patricia T Nguyen
(74) *Attorney, Agent, or Firm* — Pearne & Gordon LLP (57) ABSTRACT

A radio-frequency amplifier circuit includes first and second FETs cascode-connected to each other. The gate of the first FET is connected to a radio-frequency input terminal, and the drain of the second FET is connected to a radio-frequency output terminal. The source of the first FET is connected to a ground, and the drain of the first FET and the source of the second FET are connected to each other. A drive voltage is applied to the drain of the second FET. A bias setting unit is connected to the gate of the second FET. The bias setting unit sets a second control voltage to be applied to the second FET so that a node voltage between the drain of the first FET and the source of the second FET will be substantially half of the drive voltage.

18 Claims, 4 Drawing Sheets

(51) Int. Cl.

| | | |
|---|---|---|
| *H03G 3/10* | (2006.01) | |
| *H03F 1/02* | (2006.01) | |
| *H03F 1/22* | (2006.01) | |
| *H03F 3/193* | (2006.01) | |
| *H03F 1/32* | (2006.01) | |
| *H03F 1/56* | (2006.01) | |
| *H03F 3/195* | (2006.01) | |
| *H03F 3/24* | (2006.01) | |

(52) U.S. Cl.
CPC ............ *H03F 1/223* (2013.01); *H03F 1/226* (2013.01); *H03F 1/3205* (2013.01); *H03F 1/56* (2013.01); *H03F 3/193* (2013.01); *H03F 3/195* (2013.01); *H03F 3/1935* (2013.01); *H03F 3/245* (2013.01); *H03F 2200/108* (2013.01); *H03F 2200/222* (2013.01); *H03F 2200/318* (2013.01); *H03F 2200/387* (2013.01); *H03F 2200/451* (2013.01); *H03F 2200/516* (2013.01)

(56) References Cited

U.S. PATENT DOCUMENTS

| | | | |
|---|---|---|---|
| 2006/0103468 A1* | 5/2006 | Su | H03F 1/22 330/301 |
| 2007/0046379 A1 | 3/2007 | Tanahashi | |
| 2009/0108939 A1 | 4/2009 | Oishi | |
| 2010/0156536 A1* | 6/2010 | Lee | H03F 1/0261 330/261 |
| 2011/0285464 A1* | 11/2011 | Montalvo | H03F 1/223 330/253 |
| 2014/0152391 A1* | 6/2014 | Sowlati | H03F 1/0272 330/296 |

FOREIGN PATENT DOCUMENTS

| | | |
|---|---|---|
| JP | 2007-060458 A | 3/2007 |
| JP | 2009-105810 A | 5/2009 |

OTHER PUBLICATIONS

Translation of Written Opinion issued in Application No. PCT/JP2014/062769 dated Jul. 22, 2014.

* cited by examiner

RADIO-FREQUENCY AMPLIFIER CIRCUIT AND CONTROL VOLTAGE SETTING METHOD FOR RADIO-FREQUENCY AMPLIFIER CIRCUIT

BACKGROUND

This disclosure relates to a radio-frequency amplifier circuit in which a plurality of amplifiers are cascode-connected to each other and also to a control voltage setting method for the radio-frequency amplifier circuit.

Hitherto, for increasing the gain of amplifier circuits, various radio-frequency amplifier circuits have been provided in which a plurality of amplifiers are cascode-connected to each other.

For example, the radio-frequency amplifier circuit disclosed in Patent Document 1 includes field-effect transistors TR1 and TR2. The gate of the field-effect transistor TR1 is connected to a radio-frequency input terminal. The source of the field-effect transistor TR1 is connected to a ground. The drain of the field-effect transistor TR1 and the source of the field-effect transistor TR2 are connected to each other. The drain of the field-effect transistor TR2 is connected to a drive voltage applying terminal via a choke coil. The drain of the field-effect transistor TR2 is connected to a radio-frequency output terminal via an output matching circuit.

A control signal is applied to the gate of each of the field-effect transistors TR1 and TR2.

With this configuration, a radio-frequency amplifier circuit in which field-effect transistors TR1 and TR2 are cascode-connected to each other is implemented.

In the configuration disclosed in Patent Document 1, the output matching circuit connected to the gate of the field-effect transistor TR2 on the side of which is closer to the radio-frequency output terminal is appropriately set so as to adjust the phase shift of a radio-frequency signal passing through the radio-frequency amplifier circuit. With this arrangement, the gain control for the radio-frequency amplifier circuit is stabilized.

Patent Document 1: Japanese Unexamined Patent Application Publication No. 2002-9564

BRIEF SUMMARY

However, in the above-described cascode-connected radio-frequency amplifier circuit, if the gain is increased within the operating range, an output signal, for example, an amplified radio-frequency signal, is distorted. Due to such a distortion of a radio-frequency signal, harmonic components of the radio-frequency signal are generated.

If a radio-frequency signal containing such harmonic components is input into a demodulation integrated circuit (IC) which is connected subsequent to the radio-frequency amplifier circuit, the precision in demodulation processing performed in the demodulation IC is decreased. For example, the signal-to-noise ratio of a signal input into the demodulation IC is reduced, and the signal may not be able to be correctly demodulated.

Additionally, if the harmonic components are radiated from the radio-frequency amplifier circuit to the exterior, they affect as noise another radio-frequency circuit disposed around this radio-frequency amplifier circuit, thereby decreasing the performance of such a radio-frequency circuit.

Accordingly, the present disclosure provides a cascode-connected radio-frequency amplifier circuit that amplifies a radio-frequency signal with a high gain and a small distortion.

This disclosure relates to a cascode-connected radio-frequency amplifier circuit including first and second field-effect transistors. A gate of the first field-effect transistor serves as an input terminal for a radio-frequency signal. A source of the first field-effect transistor is connected to a ground. A source of the second field-effect transistor is connected to a drain of the first field-effect transistor. A drain of the second field-effect transistor serves as a supply terminal for a drive voltage to be supplied to the first and second field-effect transistors and serves as an output terminal for an amplified radio-frequency signal. The radio-frequency amplifier circuit has the following features.

The radio-frequency amplifier circuit includes a control voltage setting unit that applies a control voltage to a gate of the second field-effect transistor. The control voltage setting unit sets the control voltage so that a voltage at a node between the source of the second field-effect transistor and the drain of the first field-effect transistor will be equal to or less than substantially ½ of the drive voltage. With this configuration, the occurrence of distortion is suppressed.

In the radio-frequency amplifier circuit of this disclosure, the voltage at the node (voltage at the node between the source of the second field-effect transistor and the drain of the first field-effect transistor) may be 0.7 V or higher. With this configuration, the drain-source voltage of the first field-effect transistor becomes 0.7 V or higher, so that, in addition to the suppression of the occurrence of distortion described above, the voltage gain characteristics can be improved.

In the radio-frequency amplifier circuit of this disclosure, the voltage at the node (voltage at the node between the source of the second field-effect transistor and the drain of the first field-effect transistor) may be ½ of the drive voltage. With this configuration, the distortion characteristics and the voltage gain characteristics can be optimized. For example, it is possible to implement a high-gain, small-distortion radio-frequency amplifier circuit exhibiting excellent output voltage controllability.

In the radio-frequency amplifier circuit of this disclosure, a transistor size of the first field-effect transistor and a transistor size of the second field-effect transistor may be the same. This configuration indicates an example of a suitable size of the first and second field-effect transistors.

In the radio-frequency amplifier circuit of this disclosure, the control voltage setting unit may be a resistor voltage divider that generates the control voltage by dividing the drive voltage.

With this configuration, the control voltage setting unit is implemented with a circuit pattern in which a plurality of resistors are connected to each other. It is thus possible to simplify the circuit configuration of the radio-frequency amplifier circuit and also to reduce the cost.

In the radio-frequency amplifier circuit of this disclosure, the control voltage setting unit may measure the drive voltage and the control voltage so as to adjust the control voltage on the basis of measurement results.

With this configuration, even if the drive voltage is changed, the control voltage can be set precisely in accordance with a change in the drive voltage.

According to this disclosure, it is possible to amplify a radio-frequency signal with a high gain and a small distortion.

DETAILED DESCRIPTION

Figure 1:
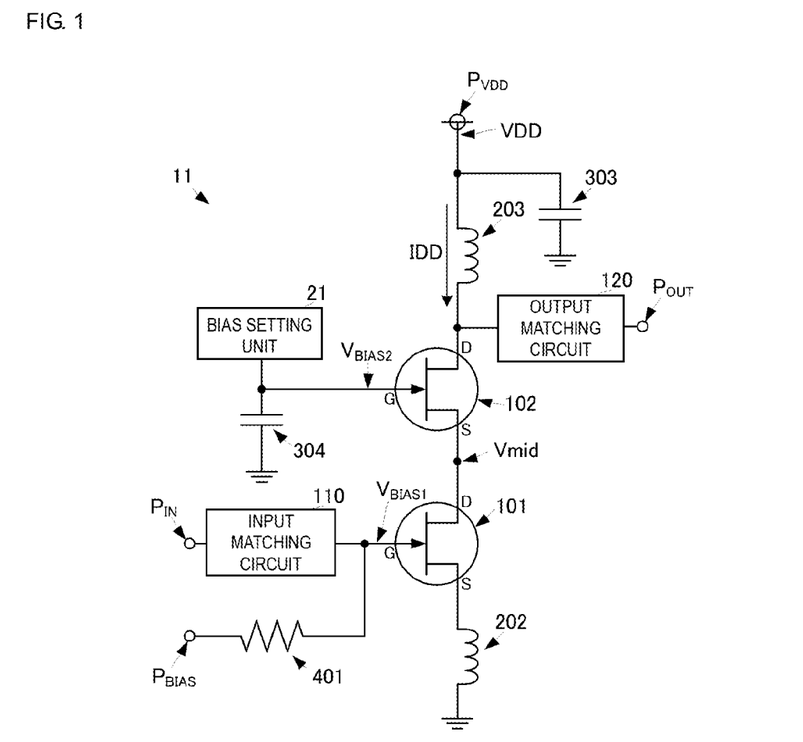
FIG. 1 is a circuit diagram of a radio-frequency amplifier circuit according to a first embodiment of the present disclosure.

A radio-frequency amplifier circuit according to a first embodiment of the present disclosure will be described below with reference to the drawings. FIG. 1 is a circuit diagram of the radio-frequency amplifier circuit according to the first embodiment of the present disclosure.

A radio-frequency amplifier circuit 11 includes a first field-effect transistor (FET) 101 and a second field-effect transistor 102. The first FET 101 and the second FET 102 are cascode-connected to each other. More specifically, the radio-frequency amplifier circuit 11 has the following circuit configuration.

The gate of the first FET 101 is connected to a radio-frequency input terminal $P_{IN}$ via an input matching circuit 110. The input matching circuit 110 is, for example, a series circuit of a coil and a capacitor connected between the gate of the first FET 101 and the radio-frequency input terminal $P_{IN}$. The input matching circuit 110 may be configured in a different manner, for example, if it includes a capacitor connected between the gate of the first FET 101 and the radio-frequency input terminal $P_{IN}$ and is able to perform impedance matching between the first FET 101 and a circuit element that is disposed prior to the input matching circuit 110 and that is connected to the radio-frequency input terminal $P_{IN}$. The gate of the first FET 101 is connected to a first control voltage applying terminal $P_{BIAS}$ via a resistor 401. A first control voltage $V_{BIAS1}$ supplied from the first control voltage applying terminal $P_{BIAS}$ is applied to the gate of the first FET 101.

The source of the first FET 101 is connected to a ground via a coil 202. The drain of the first FET 101 is connected to the source of the second FET 102.

The drain of the second FET 102 is connected to a drive voltage supply terminal $P_{VDD}$ via a coil 203. The coil 203 is a choke coil for blocking radio frequencies. The node between the drive voltage supply terminal $P_{VDD}$ and the coil 203 is connected to a ground via a capacitor 303.

The drain of the second FET 102 is connected to a radio-frequency output terminal $P_{OUT}$ via an output matching circuit 120. The output matching circuit 120 is, for example, a capacitor connected between the drain of the second FET 102 and the radio-frequency output terminal $P_{OUT}$. The output matching circuit 120 may be configured in a different manner, for example, if it includes a capacitor connected in series between the drain of the second FET 102 and the radio-frequency output terminal $P_{OUT}$ and is able to perform impedance matching between the second FET 102 and a circuit element that is disposed subsequent to the output matching circuit 120 and that is connected to the radio-frequency output terminal $P_{OUT}$.

A bias setting unit 21 is connected to the gate of the second FET 102. The bias setting unit 21 sets a second control voltage $V_{BIAS2}$, which is a control voltage for the second FET 102, as in a manner discussed later, and applies the second control voltage $V_{BIAS2}$ to the gate of the second FET 102. The node between the bias setting unit 21 and the second FET 102 is connected to a ground via a capacitor 304.

In some embodiments, the transistor size of the first FET 101 and that of the second FET 102 can be the same. The transistor size is determined by the product of the unit gate width and the finger length of a FET, and is a parameter that determines the transconductance Gm of a transistor.

In the radio-frequency amplifier circuit 11 configured as described above, a radio-frequency signal input from the radio-frequency input terminal $P_{IN}$ is amplified in the cascode-connected first and second FETs 101 and 102, and is output from the radio-frequency output terminal $P_{OUT}$. In this case, by adjusting a drive voltage VDD, the first control voltage $V_{BIAS1}$ to be applied from the first control voltage applying terminal $P_{BIAS}$ to the first FET 101, and the second control voltage $V_{BIAS2}$ to be applied from the bias setting unit 21 to the second FET 102, the radio-frequency signal can be amplified at a desired amplification factor and be output. Since the radio-frequency amplifier circuit 11 is a cascode-connected radio-frequency amplifier circuit, the output resistance can be significantly increased, and the gain of the radio-frequency amplifier circuit 11 becomes high.

As in the radio-frequency amplifier circuit 11 of this embodiment, since the first and second FETs 101 and 102 are cascode-connected to each other, the direct-current drive voltage VDD for the first and second FETs 101 and 102 is supplied from the single drive voltage supply terminal $P_{VDD}$. With this configuration, a direct-current voltage Vmid at the node between the drain of the first FET 101 and the source of the second FET 102 (hereinafter such a voltage will be referred to as the "node voltage") becomes equal to a value obtained by dividing the drive voltage VDD by the drain-source voltage of the first FET 101 and the drain-source voltage of the second FET 102, and is substantially equal to a voltage greater than the ground potential by the drain-source voltage of the first FET 101.

In the radio-frequency amplifier circuit 11 of this embodiment, the bias setting unit 21 sets the node voltage Vmid in the following manner.

Figure 2:
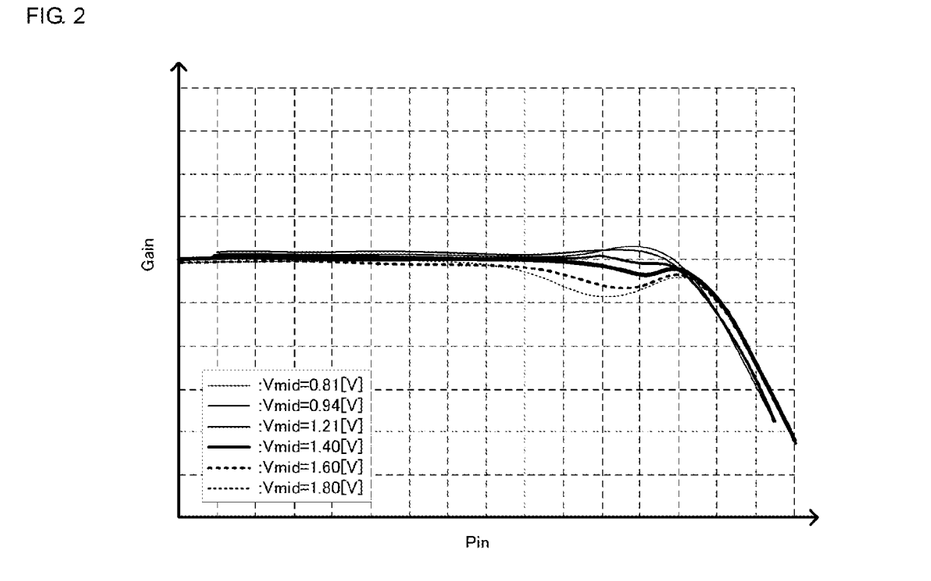
FIG. 2 is a diagram illustrating gain characteristics of the radio-frequency amplifier circuit according to the first embodiment of the present disclosure (the size of a first FET and that of a second FET are the same).

FIG. 2 is a diagram illustrating gain characteristics of the radio-frequency amplifier circuit according to the first embodiment of the present disclosure. The characteristics shown in FIG. 2 are those in a case in which the transistor size of the first FET 101 and that of the second FET 102 are the same and the value of the drive voltage VDD is 2.8[V]. The horizontal axis indicates the input power Pin of a radio-frequency signal, and the vertical axis indicates the gain of the radio-frequency amplifier circuit 11.

In the radio-frequency amplifier circuit 11 including the above-described FETs, the gain is constant until the input power Pin reaches a predetermined value, and when the input power Pin exceeds this predetermined value, the gain decreases as the input power Pin increases.

When the value of the node voltage Vmid is 1.4[V] or smaller, that is, when the node voltage Vmid is equal to or less than ½ of the drive voltage VDD, the gain is substantially constant until the input power Pin reaches the predetermined value, that is, the distortion of the gain is small, as shown in FIG. 2. On the other hand, when the value of the node voltage Vmid is 1.6[V] or greater, that is, when the node voltage Vmid is greater than ½ of the drive voltage VDD by a predetermined value or greater, the gain temporarily drops and then starts to increase before the input power Pin reaches the predetermined value, that is, the distortion of the gain is great, as shown in FIG. 2.

In this manner, when the node voltage Vmid is equal to or less than ½ of the drive voltage VDD, the distortion of the gain of the radio-frequency amplifier circuit 11 becomes smaller, so that the intermodulation distortion (IMD) of the radio-frequency amplifier circuit 11 is decreased.

Accordingly, the second control voltage $V_{BIAS2}$ is adjusted by using the bias setting unit 21 so that the node voltage Vmid will be equal to or less than ½ of the drive voltage VDD. It is thus possible to implement a radio-frequency amplifier circuit with a small distortion.

Moreover, in the radio-frequency amplifier circuit 11 of this embodiment, the bias setting unit 21 sets the node voltage Vmid by considering the following features.

Figure 3A:
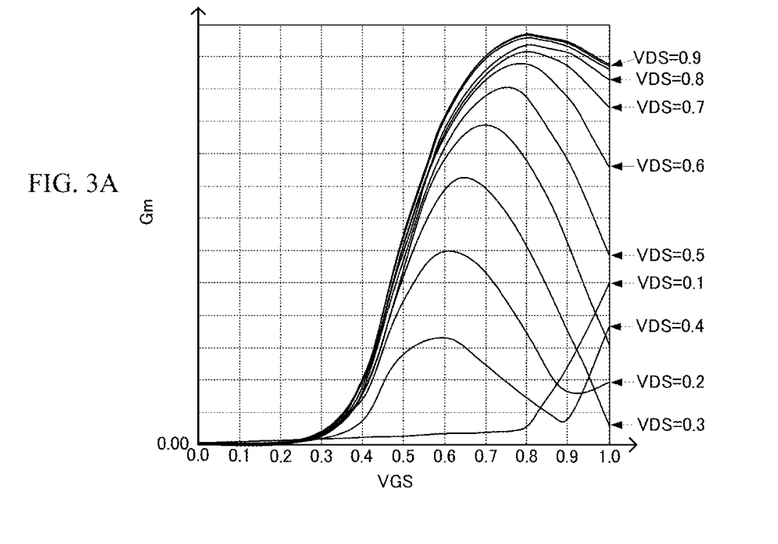
FIGS. 3A and 3B show diagrams illustrating Gm characteristics of the radio-frequency amplifier circuit according to the first embodiment of the present disclosure (the size of the first FET and that of the second FET are the same).
Figure 3B:
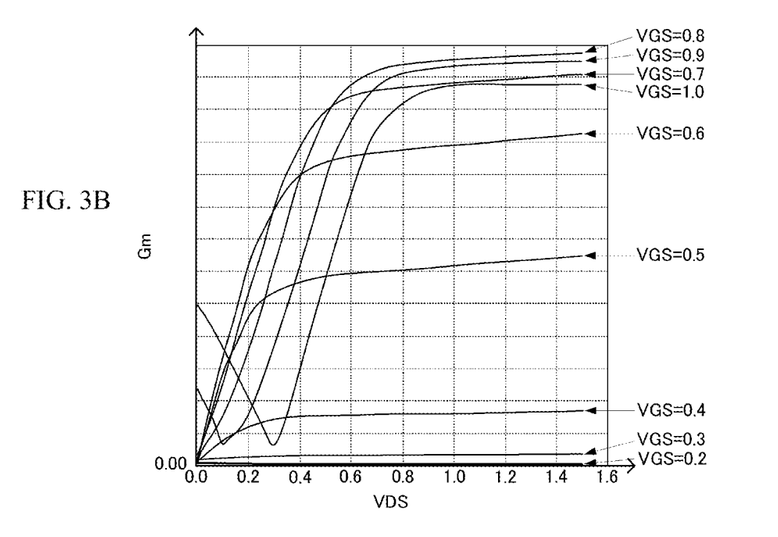

FIGS. 3A and 3B show diagrams illustrating Gm characteristics of the radio-frequency amplifier circuit according to the first embodiment of the present disclosure. FIG. 3A illustrates dependence characteristics of the transconductance Gm on the gate-source voltage VGS using the drain-source voltage VDS as a parameter, and FIG. 3B illustrates dependence characteristics of the transconductance Gm on the drain-source voltage VDS using the gate-source voltage VGS as a parameter. The gate-source voltage VGS and the drain-source voltage VDS shown in FIGS. 3A and 3B are respectively the gate-source voltage VGS and the drain-source voltage VDS of the first FET 101.

As shown in FIG. 3A, when the gate-source voltage of the first FET 101 is changed, the transconductance Gm of the radio-frequency amplifier circuit 11 is changed and thus the voltage gain Av is changed. As shown in FIG. 3A, the transition characteristics of the transconductance Gm according to a change in the gate-source voltage of the first FET 101 are different depending on the value of the drain-source voltage VDS of the first FET 101. Generally, as the drain-source voltage VDS of the first FET 101 is lower, the transconductance Gm is lower, and as the drain-source voltage VDS of the first FET 101 is higher, the transconductance Gm is higher. Accordingly, the drain-source voltage VDS of the first FET 101 can be as high as possible. However, as shown in FIG. 3A, if the drain-source voltage VDS is 0.7[V] or greater, the level of transconductance Gm is substantially the same. Thus, if the drain-source voltage VDS is 0.7[V] or greater, that is, if the node voltage Vmid is 0.7[V] or greater, a sufficient level of transconductance Gm can be obtained for a practical use.

As shown in FIG. 3B, regardless of the value of the gate-source voltage VGS, in a region in which the drain-source voltage VDS is 0.7[V] or greater, the transconductance Gm is substantially constant with a value according to the value of the gate-source voltage VGS.

Accordingly, the second control voltage $V_{BIAS2}$ is adjusted by using the bias setting unit 21 so that the node voltage Vmid will be 0.7[V] or greater. It is thus possible to implement a radio-frequency amplifier circuit exhibiting excellent voltage gain characteristics.

Accordingly, the second control voltage $V_{BIAS2}$ is adjusted by using the bias setting unit 21 so that the node voltage Vmid will be equal to or less than ½ of the drive voltage VDD and will be 0.7[V] or greater (0.7[V] Vmid (½) *VDD). As a result, it is possible to implement a high-gain, small-distortion radio-frequency amplifier circuit exhibiting excellent gain characteristics.

It is sufficient that the node voltage Vmid be 0.7[V] or greater and be equal to or less than ½ of the drive voltage VDD. However, if the node voltage Vmid is ½ of the drive voltage VDD, it is more likely that a high-gain, small-distortion radio-frequency amplifier circuit exhibiting excellent gain characteristics will be implemented.

The foregoing description has been given, assuming that the transistor size of the first FET 101 and that of the second FET 102 are substantially similar. However, the transistor size of the first FET 101 and that of the second FET 102 do not necessarily have to be exactly the same, and they may be different from each other. In this case, the transistor size of the first FET 101 can be smaller than that of the second FET 102 and can be equal to or greater than half of the transistor size of the second FET 102.

Figure 4:
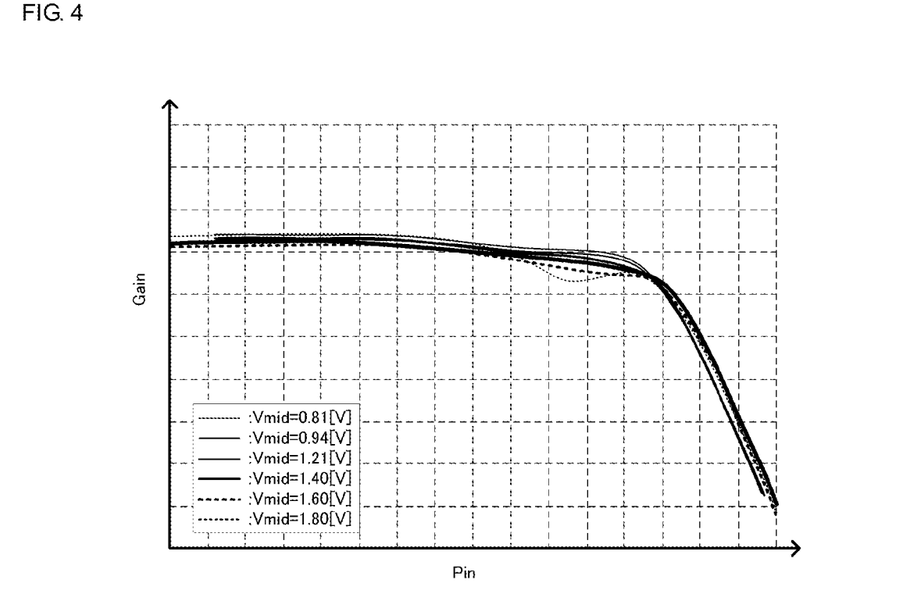
FIG. 4 is a diagram illustrating gain characteristics of the radio-frequency amplifier circuit according to the first embodiment of the present disclosure (the size of the first FET and that of the second FET are different).

FIG. 4 is a diagram illustrating gain characteristics of the radio-frequency amplifier circuit according to the first embodiment of the present disclosure. The characteristics shown in FIG. 4 are those in a case in which the transistor size of the first FET 101 is half of that of the second FET 102.

As shown in FIG. 4, even in a case in which the transistor size of the first FET 101 and that of the second FET 102 are different, when the value of the node voltage Vmid is 1.4[V] or smaller, that is, when the node voltage Vmid is equal to or smaller than ½ of the drive voltage VDD, the gain is substantially constant until the input power Pin reaches a predetermined value, that is, the distortion of the gain is small, as shown in FIG. 4. On the other hand, when the value of the node voltage Vmid is 1.6[V] or greater, that is, when the node voltage Vmid is greater than ½ of the drive voltage VDD by a predetermined value or greater, the gain temporarily drops and then starts to increase before the input power Pin reaches the predetermined value, that is, the distortion of the gain is great, as shown in FIG. 4.

Accordingly, even in a case in which the transistor size of the first FET 101 and that of the second FET 102 are different, if the second control voltage $V_{BIAS2}$ is adjusted by using the bias setting unit 21 so that the node voltage Vmid will be 0.7[V] or higher and be equal to or less than ½ of the drive voltage VDD, it is possible to implement a high-gain, low-distortion radio-frequency amplifier circuit exhibiting excellent gain characteristics.

Figure 5:
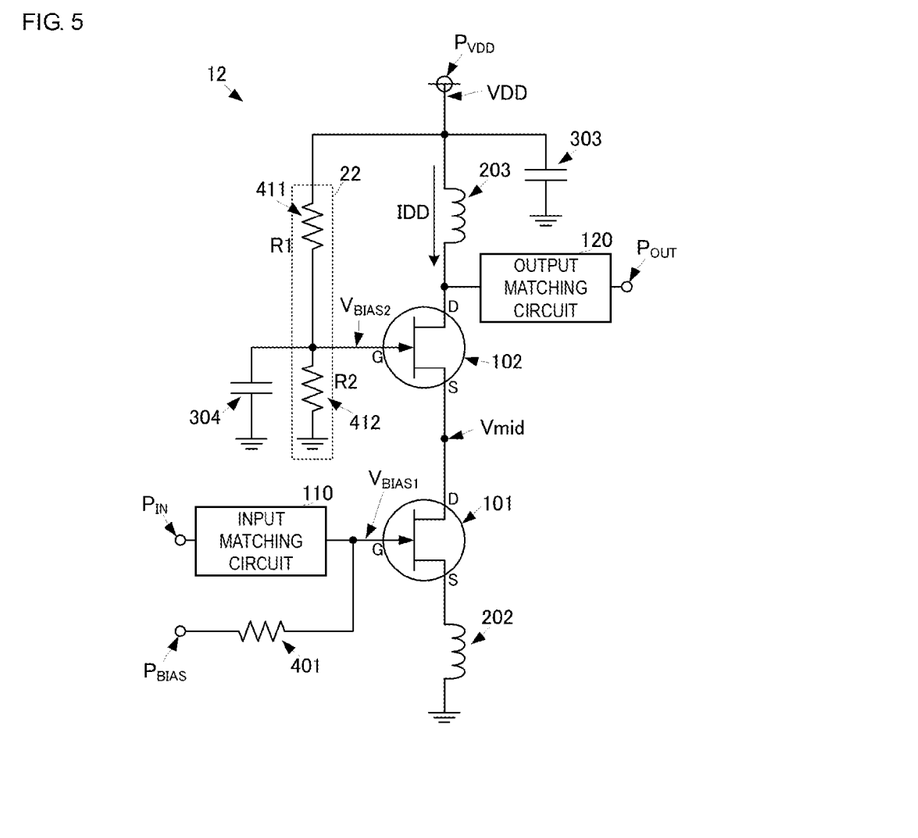
FIG. 5 is a circuit diagram of a radio-frequency amplifier circuit according to a second embodiment of the present disclosure.

A radio-frequency amplifier circuit according to a second embodiment of the present disclosure will be described below with reference to the drawing. FIG. 5 is a circuit diagram illustrating the radio-frequency amplifier circuit according to the second embodiment of the present disclosure.

A radio-frequency amplifier circuit 12 of this embodiment includes a bias setting unit 22 instead of the bias setting unit 21 of the first embodiment. The configurations of the other elements are the same as those of the radio-frequency amplifier circuit 11 of the first embodiment. Thus, portions different from the first embodiment only will be specifically described below.

The bias setting unit 22 is constituted by a voltage divider including resistors 411 and 412. The resistors 411 and 412 are connected in series with each other. One end portion of this series circuit closer to the resistor 411 is connected to the drive voltage supply terminal $P_{VDD}$, while the other end portion thereof closer to the resistor 412 is connected to a ground. The node between the resistors 411 and 412 is connected to the gate of the second FET 102 and is also connected to a ground via the capacitor 304.

With this configuration, the resistance R1 of the resistor 411 and the resistance R2 of the resistor 412 are set so that the node voltage Vmid will be 0.7[V] or greater and be equal to or less than ½ of the drive voltage VDD.

With this configuration, advantages similar to those of the above-described first embodiment can be obtained. Additionally, with the configuration of this embodiment, the bias setting unit 22 is constituted only by the resistors 411 and 412. Accordingly, the bias setting unit 21 can be implemented with a simple configuration using passive elements without necessarily active elements, such as an IC. This makes it possible to achieve, for example, a cost reduction.

The value of the second control voltage $V_{BIAS2}$ is changed in accordance with the value of the drive voltage VDD, thereby adjusting the value of the node voltage Vmid. Accordingly, it is possible to set the node voltage Vmid according to the value of the drive voltage VDD.

Figure 6:
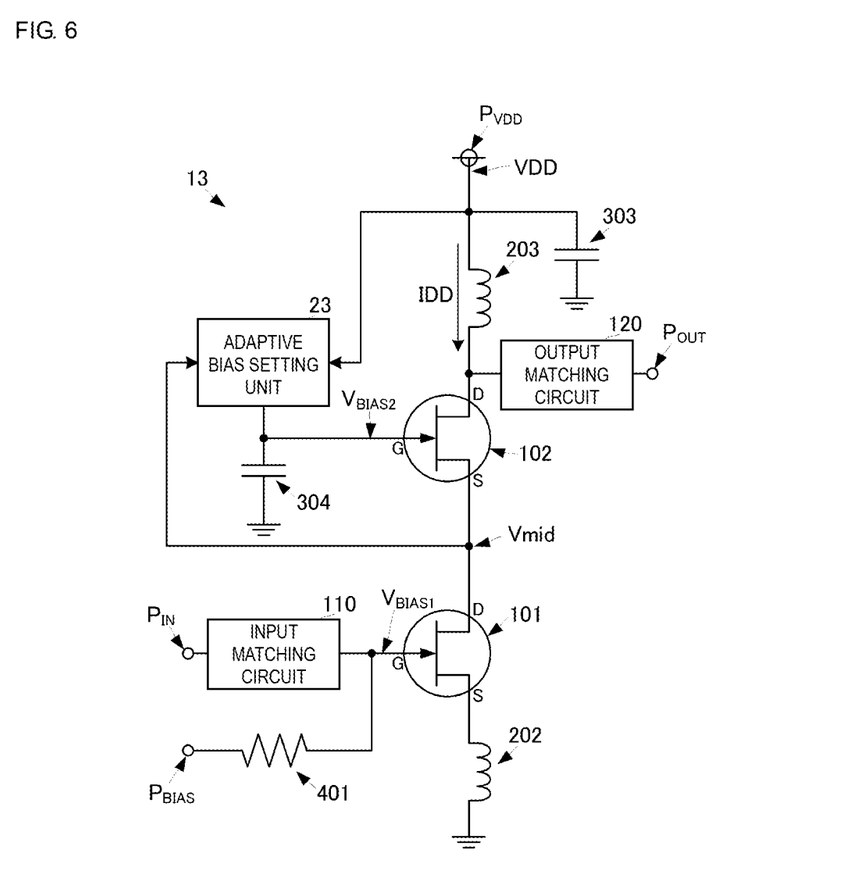
FIG. 6 is a circuit diagram of a radio-frequency amplifier circuit according to a third embodiment of the present disclosure.

A radio-frequency amplifier circuit according to a third embodiment of the present disclosure will be described below with reference to the drawing. FIG. 6 is a circuit diagram illustrating the radio-frequency amplifier circuit according to the third embodiment of the present disclosure.

A radio-frequency amplifier circuit 13 of this embodiment includes an adaptive bias setting unit 23 instead of the bias setting unit 21 of the first embodiment. The configurations of the other elements are the same as those of the radio-frequency amplifier circuit 11 of the first embodiment. Thus, portions different from the first embodiment only will be specifically described below.

The adaptive bias setting unit 23 is connected to the gate of the second FET 102 so as to apply the second control voltage $V_{BIAS2}$ to the gate of the second FET 102. The adaptive bias setting unit 23 measures the drive voltage VDD and the node voltage Vmid at preset sampling time intervals. On the basis of the measurement results of the drive voltage VDD and the node voltage Vmid, the adaptive bias setting unit 23 adjusts the second control voltage $V_{BIAS2}$ so that the node voltage Vmid will be 0.7[V] or greater and be a predetermined value which is equal to or less than ½ of the drive voltage VDD (for example, which is ½ of the drive voltage VDD). That is, the adaptive bias setting unit 23 feeds back the measurement results of the drive voltage VDD and the node voltage Vmid to the adjustment of the second control voltage $V_{BIAS2}$.

With this configuration, too, advantages similar to those of the above-described first embodiment can be obtained. Additionally, with the configuration of this embodiment, the node voltage Vmid can be set in accordance with the drive voltage VDD. Accordingly, even if the drive voltage VDD is changed, the node voltage Vmid can be set to be an optimal value. Moreover, with the configuration of this embodiment, the node voltage Vmid can not only be adjusted by the division of the drive voltage VDD, but it can also be set to be a more appropriate value on the basis of a desired amplification factor and a distortion allowance range.

REFERENCE SIGNS LIST 11, 12, 13: radio-frequency amplifier circuit
21, 22: bias setting unit
23: adaptive bias setting unit
401, 411, 412: resistor
101: first field-effect transistor (FET)
102: second field-effect transistor (FET)
110: input matching circuit
120: output matching circuit
202, 203: coil
303, 304: capacitor

The invention claimed is:

1. A radio-frequency amplifier circuit being a cascode-connected radio-frequency amplifier circuit including first and second field-effect transistors, a gate of the first field-effect transistor serving as an input terminal for a radio-frequency signal, a source of the first field-effect transistor being connected to a ground, a source of the second field-effect transistor being connected to a drain of the first field-effect transistor, a drain of the second field-effect transistor serving as a supply terminal for a drive voltage to be supplied to the first and second field-effect transistors and serving as an output terminal for an amplified radio-frequency signal,
the radio-frequency amplifier circuit comprising:
a control voltage setting unit that applies a control voltage to a gate of the second field-effect transistor,
wherein a transistor size of the first field-effect transistor is the same as a transistor size of the second field-effect transistor, and
wherein the control voltage setting unit sets the control voltage so that a voltage at a node between the source of the second field-effect transistor and the drain of the first field-effect transistor is equal to or less than one half of the drive voltage.

2. The radio-frequency amplifier circuit according to claim 1, wherein the voltage at the node is at least 0.7 V.

3. The radio-frequency amplifier circuit according to claim 1, wherein the voltage at the node is one half of the drive voltage.

4. The radio-frequency amplifier circuit according to claim 1, wherein the control voltage setting unit is a resistor voltage divider that generates the control voltage by dividing the drive voltage.

5. The radio frequency amplifier circuit according to claim 4, wherein the gate of the second field-effect transistor is connected between two resistors of the resistor voltage divider.

6. The radio-frequency amplifier circuit according to claim 1, wherein the control voltage setting unit measures the drive voltage and the voltage at the node so as to adjust the control voltage on the basis of measurement results.

7. A control voltage setting method for a cascode-connected radio-frequency amplifier circuit including first and second field-effect transistors, a gate of the first field-effect transistor serving as an input terminal for a radio-frequency signal, a source of the first field-effect transistor being connected to a ground, a source of the second field-effect transistor being connected to a drain of the first field-effect transistor, a drain of the second field-effect transistor serving as a supply terminal for a drive voltage to be supplied to the first and second field-effect transistors and serving as an output terminal for an amplified radio-frequency signal, a control voltage being applied to a gate of the second field-effect transistor,
the control voltage setting method comprising:
setting the control voltage so that a voltage at a node between the source of the second field-effect transistor and the drain of the first field-effect transistor is equal to or less than one half of the drive voltage, wherein a transistor size of the first field-effect transistor is the same as a transistor size of the second field-effect transistor.

8. The control voltage setting method according to claim 7, wherein the voltage at the node is at least 0.7 V.

9. The control voltage setting method according to claim 7, wherein the voltage at the node is one half of the drive voltage.

10. The radio-frequency amplifier circuit according to claim 7, wherein the control voltage is set by dividing the drive voltage with a resistor voltage divider.

11. The radio frequency amplifier circuit according to claim 10, wherein the gate of the second field-effect transistor is connected between two resistors of the resistor voltage divider.

12. The radio-frequency amplifier circuit according to claim 1, wherein the control voltage is set by measuring the drive voltage and the voltage at the node so as to adjust the control voltage on the basis of measurement results.

13. The radio-frequency amplifier circuit according to claim 2, wherein the voltage at the node is one half of the drive voltage.

14. The radio-frequency amplifier circuit according to claim 2, wherein a transistor size of the first field-effect transistor is the same as a transistor size of the second field-effect transistor.

15. The radio-frequency amplifier circuit according to claim 3, wherein a transistor size of the first field-effect transistor is the same as a transistor size of the second field-effect transistor.

16. The radio-frequency amplifier circuit according to claim 2, wherein the control voltage setting unit measures the drive voltage and the voltage at the node so as to adjust the control voltage on the basis of measurement results.

17. The radio-frequency amplifier circuit according to claim 3, wherein the control voltage setting unit measures the drive voltage and the voltage at the node so as to adjust the control voltage on the basis of measurement results.

18. The radio-frequency amplifier circuit according to claim 3, wherein the control voltage setting unit measures the drive voltage and the voltage at the node so as to adjust the control voltage on the basis of measurement results.

\* \* \* \* \*

UNITED STATES PATENT AND TRADEMARK OFFICE
CERTIFICATE OF CORRECTION

PATENT NO. : 9,479,117 B2
APPLICATION NO. : 14/926367
DATED : October 25, 2016
INVENTOR(S) : Wakaki It is certified that error appears in the above-identified patent and that said Letters Patent is hereby corrected as shown below:

In the Specification

Column 6, Line 6:
Please delete "(0.7[V] Vmid (1/2) * VDD)" and replace it with -- (0.7[V] $\leq$ Vmid $\leq$ (1/2) * VDD) --

Signed and Sealed this
Third Day of January, 2017

Michelle K. Lee
*Director of the United States Patent and Trademark Office*